United States Patent
Zhang et al.

(10) Patent No.: US 9,312,310 B2
(45) Date of Patent: Apr. 12, 2016

(54) DISPLAY PANEL, FABRICATING METHOD THEREOF AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Chunbing Zhang, Beijing (CN); Zheng Wang, Beijing (CN); Liyan Xu, Beijing (CN); Yusheng Xi, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 14/345,064

(22) PCT Filed: Nov. 14, 2013

(86) PCT No.: PCT/CN2013/087139
§ 371 (c)(1),
(2) Date: Mar. 14, 2014

(87) PCT Pub. No.: WO2014/183398
PCT Pub. Date: Nov. 20, 2014

(65) Prior Publication Data
US 2015/0303241 A1    Oct. 22, 2015

(30) Foreign Application Priority Data
May 16, 2013   (CN) .......................... 2013 1 0181960

(51) Int. Cl.
*H01L 27/32* (2006.01)
*H01L 51/56* (2006.01)
(Continued)

(52) U.S. Cl.
CPC ........ *H01L 27/3213* (2013.01); *H01L 27/3218* (2013.01); *H01L 51/5206* (2013.01);
(Continued)

(58) Field of Classification Search
None
See application file for complete search history.

(56) References Cited

U.S. PATENT DOCUMENTS

2007/0103066 A1* 5/2007 D'Andrade ......... H01L 27/3209
                                              313/506
2014/0247200 A1* 9/2014 Jinta ..................... H01L 25/048
                                              345/76

FOREIGN PATENT DOCUMENTS

CN       1815748 A      8/2006
CN     202977420 U      6/2013
(Continued)

OTHER PUBLICATIONS

Written Opinion of the International Searching Authority dated Feb. 14, 2014, PCT/CN2013/087139.
First Chinese Office Action dated Oct. 10, 2014, Appln. No. 201310181960.8.

*Primary Examiner* — Ashok Patel
(74) *Attorney, Agent, or Firm* — Ladas & Parry LLP

(57) ABSTRACT

A display panel, a fabricating method thereof and a display device. The display panel, including: a transparent substrate; a plurality of display pixels, provided on the transparent substrate, wherein each of the plurality of display pixels includes: a plurality of first transparent self-luminous sub-pixels, provided on a light exiting surface of the transparent substrate; and a plurality of second self-luminous sub-pixels, provided on a surface of the transparent substrate opposite to the light exiting surface, and a light exiting direction of each of the second sub-pixels a direction towards the light exiting surface of the transparent substrate.

20 Claims, 3 Drawing Sheets

(51) Int. Cl.
*H01L 33/00* (2010.01)
*H01L 51/52* (2006.01)

(52) U.S. Cl.
CPC ............ *H01L51/5221* (2013.01); *H01L 51/56* (2013.01); *H01L 27/3209* (2013.01); *H01L 2251/5323* (2013.01)

(56) References Cited

FOREIGN PATENT DOCUMENTS

| | | |
|---|---|---|
| CN | 103325318 A | 9/2013 |
| CN | 203232657 A | 10/2013 |

\* cited by examiner

DISPLAY PANEL, FABRICATING METHOD THEREOF AND DISPLAY DEVICE

TECHNICAL FIELD

The embodiments of the present invention relate to a display panel, a fabricating method thereof and a display device.

BACKGROUND

An OLED (Organic Light Emitting Diode) display device is proposed as a next generation flat panel display device due to its advantages of self-illumination, high contrast, small thickness, wide viewing angle, fast response speed, flexibility, wide operating temperature range, simple structure and simple fabricating process, etc.

However, the OLED display device has limitations in high resolution and high color gamut. In the OLED display device, a threshold voltage of the TFT (Thin Film Transistor) driving the OLED to emit light is related to many factors, comprising doping of a drain of the TFT, a thickness of a dielectric, material of a gate, excess electric charges in the dielectric, etc. However, during fabricating a current display panel, especially a large-sized display panel, the consistency of such factors can hardly be achieved due to limitations of process conditions and technological level, which causes each TFT to have a different deviation in the threshold voltage, and further, long-time operating will also lead to lowered stability of the TFT. Therefore, to ensure the uniformity of the brightness of the OLED display panel, an additional compensation circuit is needed to compensate the inconsistency (or deviation) of the threshold voltages of the TFTs, however, most of compensation circuits need 4-6 TFTs and 1-2 storage capacitors, which usually renders a large pixel size and then does not help development of high resolution.

SUMMARY

The embodiments of the present invention provide a display panel and a fabricating method thereof and a display device in which more pixels can be arranged on a limited substrate, thus, a higher resolution can be achieved and the effect of improving display color gamut can be achieved.

According to one aspect, an embodiment of the present invention provides a display panel, comprising: a transparent substrate; a plurality of display pixels, provided on the transparent substrate, wherein each of the plurality of display pixels comprises: a plurality of first transparent self-luminous sub-pixels, provided on a light exiting surface of the transparent substrate; and a plurality of second self-luminous sub-pixels, provided on a surface of the transparent substrate opposite to the light exiting surface, and a light exiting direction of each of the second sub-pixels comprises a direction towards the light exiting surface of the transparent substrate.

According to another aspect, an embodiment of the present invention also provides a display device comprising the above display panel.

According to another aspect, an embodiment of the present invention provides a fabricating method of a display panel, comprising: preparing a transparent substrate; forming a plurality of first transparent self-luminous sub-pixels on a light exiting surface of the transparent substrate; and forming a plurality of second self-luminous sub-pixels on a surface of the transparent substrate opposite to the light exiting surface, wherein the plurality of second self-luminous sub-pixels are in a one-to-one correspondence relationship with the plurality of first transparent self-luminous sub-pixels, and a light exiting direction of each of the second sub-pixels comprises a direction towards the light exiting surface of the transparent substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

A First Embodiment

Figure 1:
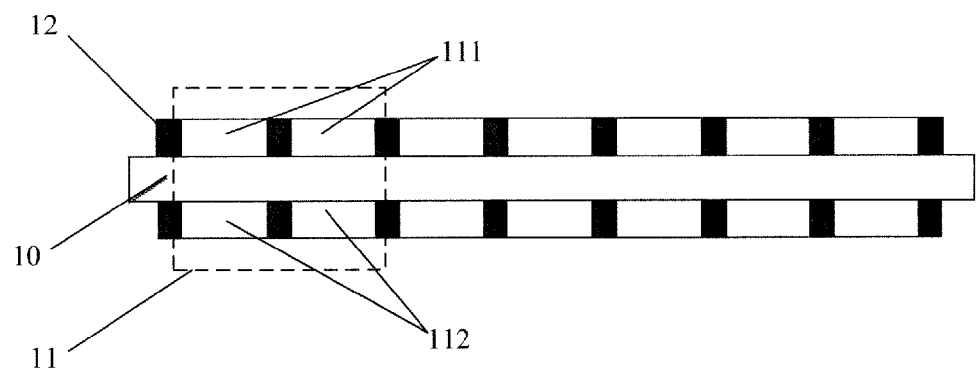
FIG. 1 is a simple cross-section structural view of a display panel according to an embodiment of the present invention.

The first embodiment of the present invention provides a display panel, as shown in FIG. 1, the display panel comprises: a transparent substrate 10; a plurality of display pixels 11 provided on the transparent substrate 10, wherein each of the display pixels comprises: first transparent self-luminous sub-pixels 111 provided on a front surface of the transparent substrate 10; second self-luminous sub-pixels 112 provided on a back surface of the transparent substrate 10, and a light exiting direction of the second sub-pixels 112 comprises a direction towards the front surface of the transparent substrate 10, i.e., an upward direction in the drawing.

The front surface of the transparent substrate 10 in the embodiment refers to a surface close to a light exiting surface (viewing surface) side of the display panel, that is, a upper surface of the transparent substrate 10 shown in FIG. 1, and the back surface of the transparent substrate 10 is the other surface of the transparent substrate 10 which is opposite to the front surface and far away from the light exiting surface of the display panel, that is, a lower surface of the transparent substrate 10 in FIG. 1.

The first self-luminous sub-pixels and the second self-luminous sub-pixels in the embodiment can be OLEDs, each of the OLEDs comprising a cathode, an anode and a light emitting layer between the cathode and the anode, of course, some of the OLEDs can comprise other auxiliary layers, such as an electron injection layer, an electron transport layer, a hole injection layer, a hole transport layer, a barrier layer, etc.

There may be a plurality of light exiting directions of the first sub-pixels 111 and the second sub-pixels 112, for example, top emission, bottom emission and double-faced emission. The first sub-pixels 111 in the embodiment are transparent OLEDs, thus, are in the double-faced emission. The second sub-pixels 112 only need to emit light from the light exiting surface of the display panel, thus, its light exiting direction at least comprises a direction towards the front surface of the transparent substrate 10. Of course, the second sub-pixels 112 can also emits light from the top and from the bottom, that is, the light exiting direction thereof comprises a direction opposite to the front surface of the transparent substrate 10 except the direction towards the front surface of the transparent substrate 10, and however, in this situation, the utilization efficiency of the light is greatly lowered, thus, a structure of top emission and bottom reflection is provided.

In the embodiment, the first transparent sub-pixels 111 are provided on the front surface of the transparent substrate 10, the second sub-pixels 112 are provided on the back surface of the transparent substrate 10, the first sub-pixels 111 and the second sub-pixels 112 jointly constitute the display pixels 11, and the brightness of each sub-pixel can be separately controlled to achieve the gray scale displaying. The first sub-pixels 111 are transparent, thus, although the second sub-pixels 112 are provided on the back surface of the transparent substrate 10, the light emitted by the second sub-pixels 112 can still pass through the transparent substrate 10 and the first sub-pixels 111 and then is emitted out from the light exiting surface of the display panel.

Therefore, compared with a traditional single-faced arrangement, for the display panel provided by the embodiment of the present invention, because a part of the sub-pixels are provided on the other side of the substrate, an area occupied by each pixel decreases, then more pixels can be arranged on a limited area of the substrate and the higher resolution can be achieved. In addition, a part of the sub-pixels are provided on the other side of the substrate, more sub-pixels (for example, a yellow sub-pixel is added besides red/green/blue sub-pixels) can be designed in the display pixels, and then the expression range of a half tone is extended, and the effect of improving the display color gamut can be achieved.

Exemplarily, the display pixels 11 can comprise the same number of first sub-pixels 111 and second sub-pixels 112 which have substantially the same size and specification, and their difference only lies in materials of the light emitting layers, and during fabricating, the same mask can be used and fabricating steps are substantially the same. During the fabricating, each of the sub-pixels comprises a cathode, an anode and a light emitting layer located therebetween, wherein the cathodes and the anodes of different colors of first sub-pixels 111 located on the front surface of the transparent substrate 10 can be formed in one fabricating process, and the light emitting layers of the different colors of the first sub-pixels 111 need to be formed by using a mask through a plurality of evaporations, and different colors of the second sub-pixels 112 located on the back surface of the transparent 10 are formed in the same way.

Exemplarily, each display pixel 11 comprises: two first sub-pixels 111 provided on the front surface of the transparent substrate 10 and two second sub-pixels 112 provided on the back surface of the transparent substrate 10.

Usually, the display pixel comprises at least three (red/green/blue) sub-pixels, and in the embodiment of the present invention, three of four sub-pixels (two first sub-pixels 111 and two second sub-pixels 112) are designed to be red/green/blue sub-pixels respectively, and the remaining one can be designed as a sub-pixel that can emit any other color of light, such as, a orange light and a yellow light.

Exemplarily, to achieve the better color mixing and display effect of each display pixel, the first sub-pixels 111 provided on the front surface of the transparent substrate 10 are in a one-to-one correspondence relationship with the second sub-pixels 112 provided on the back surface of the transparent substrate 10, that is, at a position corresponding to each of the first sub-pixels 111, one corresponding second sub-pixel 112 is provided on the back surface of the transparent substrate 10.

In view of the short service life of a blue OLED, exemplarily, in the embodiment of the present invention, any two of the four sub-pixels can be designed to be blue OLEDs, that is, the two first sub-pixels 111 and the two second sub-pixels 112 are respectively a green OLED, a red OLED and two blue OLEDs, and the two blue OLEDs are used in turn, or, the two blue OLEDs are used together under a lowered intensity so that the service life of the sub-pixels emitting blue light (blue OLEDs) may be substantially equal to that of the green OLED and the red OLED, and thus, the service life of the display panel can be prolonged. Exemplarily, the two first sub-pixels can be both blue OLEDs, then correspondingly, one of the two second sub-pixels can be a red OLED and the other can be a green OLED. Furthermore, one of the two blue OLEDs can be designed to be a dark blue OLED and the other one is designed to be a soft blue OLED.

Figure 2:
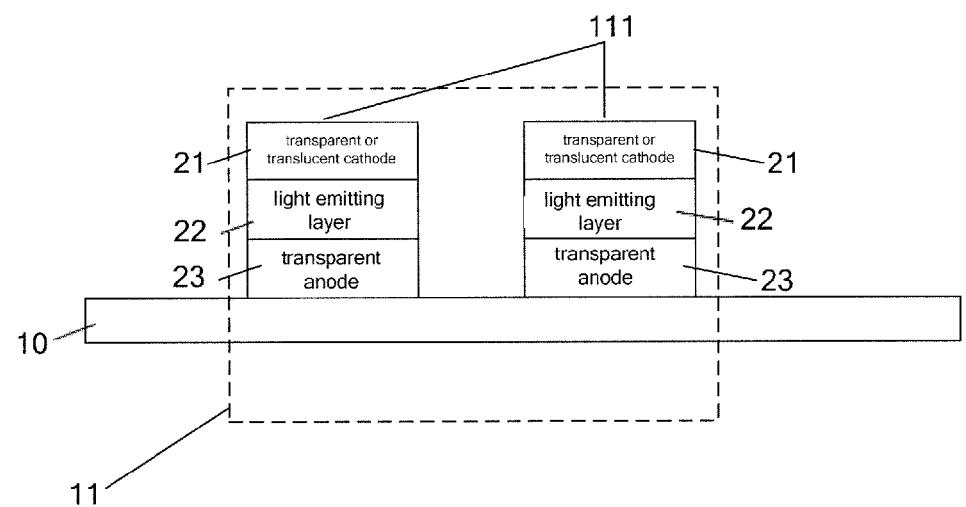
FIG. 2 is a simple cross-section structural view of a first sub-pixel in the display panel according to the embodiment of the present invention.

Exemplarily, the first sub-pixels 111 provided on the front surface of the transparent substrate 10 need to be transparent, thus light emitted from the second sub-pixels 112 provided on the back surface of the transparent substrate 10 can pass through the first sub-pixels 111 and then is emitted out. Therefore, it is determined that light exitting directions of the LEDs in the first sub-pixels 111 are double directions, i.e., double-faced light emission, and each of the layers comprised in the first sub-pixels 111 is formed of a transparent material. As shown in FIG. 2, in an optional embodiment of the present embodiment, the first sub-pixels 111 can comprise: a transparent anode 23 provided on the front surface of the transparent substrate 10; a light emitting layer 22 provided on the transparent anode 23; and a transparent or translucent cathode 21 provided on the light emitting layer 22. It needs to be indicated that the transparent anode usually is an ITO (indium tin oxides) film, the cathode is usually formed of metal material, as the metal material can not be completely transparent, a translucent cathode is used. Of course, in some OLED structures, the cathode and the anode can both be ITOs so that the cathode and the anode are both transparent, while its conductivity is somewhat lowered. In some other OLED structures, the cathode, the light emitting layer and the anode can be sequentially provided on the front surface of the transparent substrate 10. Variations of such structure are not defined in the embodiments of the present invention.

Figure 3:
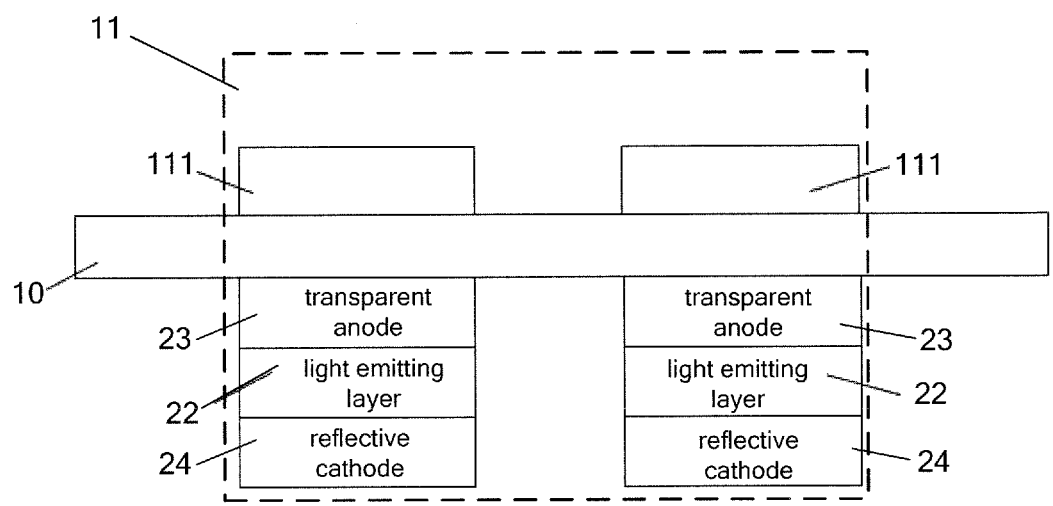
FIG. 3 is a simple cross-section structural view of a second sub-pixel in the display panel according to the embodiment of the present invention.

For the second sub-pixels 112 provided on the back surface of the transparent substrate 10, light they emit needs to be able to be emitted out only from the light exiting surface of the display panel, thus, a pixel design of top-emission and bottom-reflection is used. As shown in FIG. 3, in an optional example of the embodiment, the second sub-pixels 112 can comprise: a transparent anode 23 provided on the back surface of the transparent substrate 10; a light emitting layer 22 provided on the transparent anode 23; and a reflective cathode 24 provided on the light emitting layer 22. It needs to be noted that, as the second sub-pixels 112 shown in the drawing are located on the back surface of the transparent substrate 10, that is, a bottom surface of the transparent substrate 10, a term "on" described in the above layers actually refers to a downward direction shown in the drawing, that is, the downward direction from the back surface of the transparent substrate 10, and the transparent anode 23, the light emitting layer 22 and the reflective cathode 24 are provided in this order.

Furthermore, as shown in FIG. 1, the display panel according to the embodiment of the present invention can comprise: a black matrix 12, which can be formed on the transparent substrate 1, between the display pixels 10, between the first sub-pixels of the display pixels 10 and between the second sub-pixels of the display pixels 10, so as to separate different display pixels among the display pixels 10, different first sub-pixels among the first sub-pixels 111 and different second sub-pixels of the second sub-pixels 112. It needs to be indicated that, to achieve the better color mixing and display effect of each display pixel, the first sub-pixels 111 provided on the front surface of the transparent substrate 10 correspond to the second sub-pixels 112 provided on the back surface of the transparent substrate 10, then the black matrixes 12 provided on the front surface and the back surface of the transparent substrate 10 also correspond to each other, that is, at a position where the black matrixe 12 is provided on the front surface of the transparent substrate 10, the black matrix is also provided on the back surface of the transparent substrate 10, thus the aperture ratio can be improved by providing the black matrixes on the front surface and the back face of the transparent substrate 10 at the same position.

The display panel provided by the embodiment of the present invention uses a transparent substrate, and the OLED pixels at the light exiting surface side is formed to have a transparent structure, thus, a part of the sub-pixels traditionally positioned on the same plane are disposed on the other side of the substrate, and then an area occupied by each pixel is lowered. Compared with the existing arrangement that three sub-pixels are located on the same plane, in the situation of arranging the same size of pixels on the same substrate, the number of the pixels arranged on the substrate can be increased by 30% using the technical solution of the present invention, thus, the resolution is improved and a high color gamut can be obtained.

A Second Embodiment

The second embodiment of the present invention further provides a display device comprising any of the above display panels. The display device can have a higher resolution and a improved display color gamut, and the display device can be any product or merber having a display function, such as, an electronic paper, a mobile phone, a tablet computer, a television, a display, a notebook computer, a digital photo frame and a navigator.

A Third Embodiment

Figure 4:
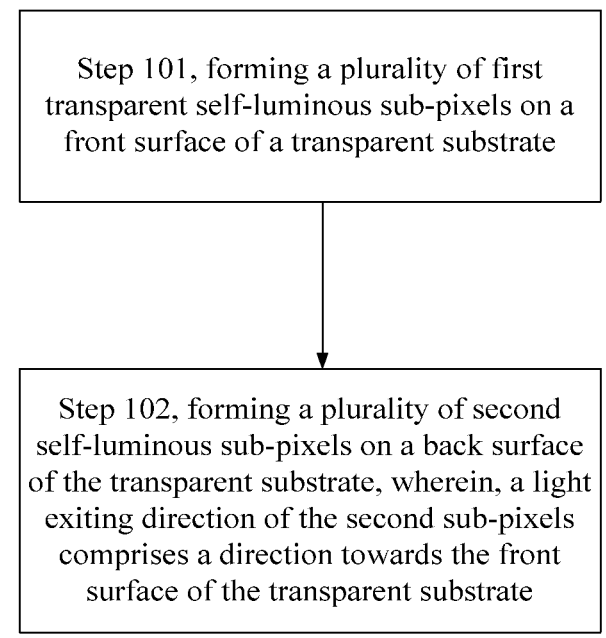
FIG. 4 is a flow view of a fabricating method of a display panel according to an embodiment of the present invention.

The third embodiment of the present invention further provides a fabricating method of a display panel as shown in FIG. 4, comprising:

Step 101, forming a plurality of first transparent self-luminous sub-pixels on a front surface of a transparent substrate; and Step 102, forming a plurality of second self-luminous sub-pixels on a back surface of the transparent substrate, wherein, a light exiting direction of the second sub-pixels comprises a direction towards the front surface of the transparent substrate.

It needs to be indicated that an order of the above steps 101 and 102 is not limited, that is, the first sub-pixels can be first formed on the front surface of the transparent substrate and then the second sub-pixels are formed on the back surface of the transparent substrate, or, the second sub-pixels can be first formed on the back surface of the transparent substrate and then the first sub-pixels are formed on the front surface of the transparent substrate.

In the fabricating method according to the embodiment, a transparent substrate is used, and the front surface and the back face of the transparent substrate both need to provided with sub-pixels, and the first sub-pixels provided on the front surface of the transparent substrate need to be formed of transparent material, the second sub-pixels provided on the back surface of the transparent substrate are designed to be in top (a side close to the front surface of the transparent substrate) emission, and the other fabricating steps are generally similar to the prior art and are not detailed herein.

In the fabricating method of the display panel provided by the embodiment of the present invention, a transparent substrate is selected, and the OLED pixels close to the light exiting surface side are formed to have a transparent structure, thus, a part of the sub-pixels traditionally positioned on the same plane, and drive circuits, gate lines, data lines, common electrode lines, etc. connected with the sub-pixels are disposed on the other side of the substrate. Compared with a traditional single-faced arrangement, in the situation of fabricating the same size of sub-pixels on the same size of substrate, as a part of the sub-pixels are provided on the other side of the substrate and an area occupied by each pixel decreases, more pixels can be arranged on the limited substrate, and thus, a higher resolution can be achieved and the effect of improving the display color gamut can be achieved.

Optionally, the step 101 comprises:

sequentially forming a transparent anode, a light emitting layer and a transparent or translucent cathode on the front surface of the transparent substrate, as shown in FIG. 2;

Optionally, the step 102 comprises:

sequentially forming a transparent anode, a light emitting layer and a reflective cathode on the back surface of the transparent substrate, as shown in FIG. 3.

It needs to be indicated that the transparent anode formed on the front surface of the transparent substrate usually is an ITO (indium tin oxide) film, the cathode is usually formed of metal material, as the metal material can not be completely transparent, a translucent cathode is used. Of course, in some OLED structures, the cathode and the anode can both be ITOs so that the cathode and the anode are both transparent, while its conductivity is somewhat lowered. The transparent anode formed on the back surface of the transparent substrate usually is an ITO (indium tin oxides) film, and the reflective cathode usually is formed of opaque metal material. Of course, in some other OLED structures, positions of the above cathode and anode can be exchanged, that is, the cathode, the light emitting layer and the anode can be sequentially provided on the front surface of the transparent substrate 10, and the cathode, the light emitting layer and the anode can be sequentially formed on the back surface of the transparent substrate. The variations of such structure are not limited in the embodiments of the present invention.

By using the fabricating method of the display panel according to the embodiment of the present invention, more pixels can be arranged on the limited substrate, thus, a higher resolution and the effect of improving display color gamut can be achieved.

It needs to be indicated that, besides a common RGB (red/green/blue) color mixing solution, there still exist other color mixing solutions such as RGBY (red/green/blue/yellow) color mixing solution and RGBW (red/green/blue/white) color mixing solution. One skilled in the art can apply the technical solution according to the embodiment of the present invention to other color mixing solutions without any inventive effort, and this shall fall within the protection scope of the present invention.

Also, the technical features according to the embodiment of the present invention can be randomly combined in the case of no conflict.

For a traditional display panel, sub-pixels are arranged on the same plane of the substrate, as an area of the substrate is limited while the size of each pixel is usually large, the displaying resolution has an upper limit value, and thus, the high resolution pursued by a current display product cannot be met. For a display panel, a fabricating method thereof and a display device according to the embodiments of the present invention, a transparent substrate is used and sub-pixels at a light exiting surface side are formed to be a transparent structure, thus, a part of the sub-pixels traditionally positioned on the same plane are disposed on the other side of the substrate. Compared with a traditional single-faced arrangement, in the situation of fabricating the same size of sub-pixels on the same size of substrate, as a part of the sub-pixels are provided on the other side of the substrate and an area occupied by each pixel decreases, more pixels can be arranged on the limited substrate, and thus, a higher resolution can be achieved and the effect of improving the display color gamut can be achieved. In addition, a part of the sub-pixels are provided on the other side of the substrate, more sub-pixels (for example, a yellow sub-pixel is added besides red/green/blue sub-pixels) can be arranged in the display pixels, and thus, the expression range of a half tone is extended, and the effect of improving the display color gamut can be achieved.

The embodiment of the invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

The invention claimed is:

1. A display panel, comprising:
    a transparent substrate;
    a plurality of display pixels, provided on the transparent substrate, wherein each of the plurality of display pixels comprises:
        a plurality of first transparent self-luminous sub-pixels, provided on a light exiting surface of the transparent substrate; and
        a plurality of second self-luminous sub-pixels, provided on a surface of the transparent substrate opposite to the light exiting surface, and a light exiting direction of each of the second sub-pixels comprises a direction towards the light exiting surface of the transparent substrate.

2. The display panel according to claim 1, wherein the first sub-pixels are in a one-to-one correspondence relationship with the second sub-pixels.

3. The display panel according to claim 1, wherein each of the display pixels comprises the same number of first sub-pixels and second sub-pixels.

4. The display panel according to claim 3, wherein each of the display pixels comprises two first sub-pixels and two second sub-pixels in a one-to-one correspondence relationship.

5. The display panel according to claim 4, wherein the two first sub-pixels are a green organic light emitting diode and a red organic light emitting diode, and the two second sub-pixels are both blue organic light emitting diodes; or the two first sub-pixels are both blue organic light emitting diodes, and the two second sub-pixels are a green organic light emitting diode and a red organic light emitting diode.

6. The display panel according to claim 5, wherein the two blue organic light emitting diodes are respectively a dark blue organic light emitting diode and a soft blue organic light emitting diode, or a soft blue organic light emitting diode and a dark blue organic light emitting diode.

7. The display panel according to claim 1, wherein each of the first sub-pixels comprises:
    a transparent anode, provided on the light exiting surface of the transparent substrate;
    a light emitting layer, provided on the transparent anode; and
    a transparent or translucent cathode, provided on the light emitting layer.

8. The display panel according to claim 1, wherein the light exiting direction of each of the second sub-pixels is the direction towards the light exiting surface of the transparent substrate, each of the second sub-pixels comprises:
    a transparent anode, provided on the surface of the transparent substrate opposite to the light exiting surface;
    a light emitting layer, provided on the transparent anode; and
    a reflective cathode, provided on the light emitting layer.

9. The display panel according to claim 1, wherein the light exit direction of each of the second sub-pixels is the direction towards the light exiting surface of the transparent substrate and an opposite direction, each of the second sub-pixels comprises:
    a transparent anode, provided on the surface of the transparent substrate opposite to the light exiting surface;
    a light emitting layer, provided on a side of the transparent anode opposite to the transparent substrate; and
    a transparent or translucent cathode, provided on a side of the light emitting layer opposite to the transparent anode.

10. The display panel according to claim 1, further comprising:
    a black matrix, formed on the transparent substrate, between the display pixels, between the first sub-pixels and between the second sub-pixels, so as to separate the display pixels, the first sub-pixels and the second sub-pixels.

11. The display panel according to claim 10, wherein the black matrixes separating the first sub-pixels are in a one-to-one correspondence relationship with the black matrixes separating the second sub-pixels.

12. The display panel according to claim 4, wherein the two first sub-pixels are any two of green, red, blue, and orange/yellow/white organic light emitting diodes, and the two second sub-pixels are the remaining two of them.

13. The display panel according to claim 7, wherein the transparent anode and the transparent cathode are formed of indium tin oxide and the translucent cathode is formed of metal material.

14. The display panel according to claim 1, wherein each of the first sub-pixels comprises:
    a transparent or translucent cathode, provided on the light exiting surface of the transparent substrate;
    a light emitting layer, provided on the transparent or translucent cathode; and
    a transparent anode, provided on the light emitting layer.

15. A display device, comprising the display panel according to claim 1.

16. A fabricating method of a display panel, comprising:
preparing a transparent substrate;
forming a plurality of first transparent self-luminous sub-pixels on a light exiting surface of the transparent substrate; and
forming a plurality of second self-luminous sub-pixels on a surface of the transparent substrate opposite to the light exiting surface, wherein the plurality of second self-luminous sub-pixels are in a one-to-one correspondence relationship with the plurality of first transparent self-luminous sub-pixels, and a light exiting direction of each of the second sub-pixels comprises a direction towards the light exiting surface of the transparent substrate.

17. The fabricating method according to claim 16, wherein the first sub-pixels and the second sub-pixels in the one-to-one correspondence relationship constitute display pixels.

18. The fabricating method according to claim 17, wherein each of the display pixel comprises two first sub-pixels on the light exiting surface of the transparent substrate and two second sub-pixels on the surface of the transparent substrate opposite to the light exiting surface and corresponding to the two first sub-pixels in the one-to-one correspondence relationship.

19. The fabricating method according to claim 16, wherein the forming the plurality of first transparent self-luminous sub-pixels on the light exiting surface of the transparent substrate comprises:
sequentially forming a transparent anode, a light emitting layer and a transparent or translucent cathode on the light exiting surface of the transparent substrate.

20. The fabricating method according to claim 16, wherein the forming the plurality of second sub-pixels on the surface of the transparent substrate opposite to the light exiting surface comprises:
sequentially forming a transparent anode, a light emitting layer and a reflective cathode/transparent or translucent cathode on the surface of the transparent substrate opposite to the light exiting surface.

\* \* \* \* \*